United States Patent [19]
Chang et al.

[11] 3,991,234
[45] Nov. 9, 1976

[54] PROCESS FOR COATING A LENS OF SYNTHETIC POLYMER WITH A DURABLE ABRASION RESISTANT VITREOUS COMPOSITION

[75] Inventors: Leei Chang, Keene; John A. Verburg, Troy, both of N.H.

[73] Assignee: American Optical Corporation, Southbridge, Mass.

[22] Filed: Sept. 30, 1974

[21] Appl. No.: 510,270

[52] U.S. Cl. ............................ 427/164; 427/248 C; 427/248 J; 427/296; 427/322; 428/412; 350/175 NG; 351/166
[51] Int. Cl.$^2$ ...................... B05D 3/10; B05D 5/00
[58] Field of Search ........... 350/175 NGL; 351/166; 427/163, 164, 248, 322, 399, 299; 428/412

[56] References Cited
UNITED STATES PATENTS

| | | | |
|---|---|---|---|
| 3,200,019 | 8/1965 | Scott, Jr. et al. ................. | 427/93 X |
| 3,356,522 | 12/1967 | Libbert .......................... | 427/248 X |
| 3,458,342 | 7/1969 | Cormia ........................ | 351/166 UX |
| 3,546,013 | 12/1970 | Perri et al. ............................ | 427/93 |
| 3,567,686 | 3/1971 | White et al. ................... | 260/47 XA |
| 3,607,378 | 9/1971 | Ruggiero .............................. | 427/95 |
| 3,645,779 | 2/1972 | Klenel .................................. | 427/42 |
| 3,652,379 | 3/1972 | White et al. ..................... | 351/166 X |
| 3,681,132 | 8/1972 | Pammer et al.................. | 427/248 X |
| 3,700,487 | 10/1972 | Crandon et al. .................. | 106/13 X |

*Primary Examiner*—Ronald H. Smith
*Assistant Examiner*—Evan K. Lawrence
*Attorney, Agent, or Firm*—William C. Nealon

[57] ABSTRACT

There is disclosed a process for improving the adhesion of an evaporable glass coating on a synthetic polymer lens by the application of a base vitreous coating of a mixture of silicon dioxide and silicon monoxide by evaporating silicon monoxide under vacuum in an oxygen atmosphere so that in addition to silicon monoxide, a silicon dioxide condensate is condensed on the outer surface of the lens. An outer vitreous coating is subsequently applied over said base coating. The evaporative glass outer coating can be formed essentially from boron oxide and silicon dioxide containing less than 5% by weight of sodium oxide. The evaporative glass coating can also be of fused silica, or a borosilicate glass sold under the trademark "Pyrex".

9 Claims, No Drawings

3,991,234

PROCESS FOR COATING A LENS OF SYNTHETIC POLYMER WITH A DURABLE ABRASION RESISTANT VITREOUS COMPOSITION

BACKGROUND OF THE INVENTION

Synthetic polymers, for instance, those based upon allyl resins such as diallyl glycol carbonate or polycarbonates, are used extensively for eyeglass lenses and other lenses in the optical industry. such polymeric lenses are advantageous since they can be manufactured inexpensively by casting or injection molding making it possible to obtain thereby complicated surface configurations directly without expensive grinding. While the diallyl glycol carbonates as a class of polymers are generally substantially resistant to abrasion and scratching as compared to polymethylmethacrylates, it is desirable to increase their abrasion resistance by applying thereto a hard transparent protective layer.

Field of the Invention

The invention relates to optical components such as ophthalmic lenses of synthetic polymer protected from abrasion by a coating of vitreous inorganic oxides.

Description of the Prior Art

Previous workers (German Pat. No. 1,204,048) in this art have sought to solve the problem of successfully applying a durable vitreous transparent protective layer to a synthetic polymer by applying a thin adhesive layer of $Al_2O_3$ by vapor deposition and subsequently applying a protective layer of silicon dioxide by vapor deposition. Such compositions have met with adhesion difficulties in practice and the present invention provides an improved solution to the problem of protecting a synthetic thermoplastic polymer.

In U.S. Pat. No. 3,645,779 there is disclosed the protection of a diallyl glycol carbonate polymer substrate by the vacuum deposition of a glass in which the coefficient of expansion of the glass which is to provide a protective layer is adapted to that of the synthetic substrate by altering the proportion of boron oxide in the glass. The glass disclosed has as essential components boron oxide, silicon dioxide and up to 5% by weight of $Na_2O$. It has been found that such glass has a significantly lower thermal expansion than the plastic substrate. It has also been found that it is not enough to match the coefficient of expansion of the glass to that of the synthetic polymer to achieve a commercially satisfactory eyeglass lens since the coated lenses of the prior art remain sensitive to moisture in the air, as the diallyl glycol carbonate polymers are hydroscopic. As water is absorbed by the synthetic polymer, the bond between the polymer and the hard protective layer of the prior art is weakened ewith delamination eventually occurring. The present invention provides a solution to this problem by providing improved moisture resistance and adhesion of the glass coatings to the synthetic polymer eyeglass lens even without specific attempts to match the coefficients of thermal expansion of substrate and coating.

In U.S. Pat. No. 3,811,753 there is disclosed a coated optical component made of a synthetic polymer such as polycarbonate in which either silicon monoxide or silicon dioxide or both are deposited on the outside surface of the lens as a 1 micron to 10 microns thick vitreous coating consisting essentially of silicon monoxide and silicon dioxide. Deposition of the vitreous coating is by a conventional evaporation process. The vacuum evaporation process for forming a silicon dioxide film by vaporization of silicon monoxide in an oxygen atmosphere is disclosed in U.S. Pat. No. 3,248,256.

In Reissue No. 26,857 of U.S. Pat. No. 2,920,002 there is described a process for the manufacture of thin films of absorption-free silicon dioxide by the vaporization of silicon dioxide, preferably a mixture of $SiO_2$ and Si in an atmosphere enriched with oxygen.

U.S. Pat. No. 3,700,487 discloses an anti-fog abrasion resistant coating of lightly cross-linked polyvinyl alcohol on a diallyl glycol carbonate lens in which adequate bonding of the anti-fog coating is obtained by first hydrolytically treating the polymer surface by dipping in an aqueous or alcoholic solution of caustic such as sodium or potassium hydroxide.

SUMMARY OF THE INVENTION

A process is disclosed for coating a synthetic polymer substrate. A surface treatment is required as a first step with a diallyl glycol carbonate polymer lens. Thermoplastic polymer lenses prepared by molding do not require this step. The surface is hydroxylated to promote adhesion of the subsequently applied vitreous coating by subjecting said diallyl glycol carbonate synthetic polymer substrate to aqueous alkali treatment. This treatment is followed by the application of a base coating of a mixture of silicon monoxide and silicon dioxide by evaporation of silicon monoxide in an oxygen atmosphere to form a $SiO_2$ condensate in admixture with silicon monoxide on the polymer substrate. A successive coating of an evaporable glass is applied over said base coating. The evaporable glass is selected from the group consisting of (1) silicon dioxide, glasses sold under the trademarks (2) "Vycor", or (3) "Pyrex" and (4) glass having as essential components boron oxide and silicon dioxide and containing below 5% by weight of $Na_2O$. The process is adapted to preparation of eyeglass lenses protected with a hard abrasion resistant surface which is resistant to delamination as the result of exposure of the assembly to moisture in normal usage. The optical properties of the assembly are essentially retained in comparison to those of the synthetic polymer starting material.

DESCRIPTION OF PREFERRED EMBODIMENTS

The surface treatment of the diallyl glycol carbonate lens has been found to be an important step in improving the moisture resistance of the coated assembly. Hydroxylation of the surface of the diallyl glycol carbonate is preferably effected by the use at 10° C to 40° C, preferably room temperature, of an aqueous solution of an alkali such as sodium hydroxide or potassium hydroxide. An aqueous solution may be used instead of an alcoholic one. The concentration of alkali is from about 2% by weight to about 20% by weight. The treatment time is about 2 minutes to about one hour. It is theorized that the alkali treatment of diallyl gylcol carbonate polymer splits ester groups on the polymer chain and introduces OH groups onto the chain. The polycarbonate lens need not be surface treated prior to application of base and outer vitreous coatings. The degree of water resistance obtained by the hydroxylation treatment of the invention is such that in comparing glass coated diallyl glycol carbonate surfaces both with the hydroxylation of the surface and not including such hydroxylation treatment, it has been found that under conditions involving exposing the assembly to 95% relative humidity at 160° F for 8 hours that only when the hydroxylation treatment is performed is the glass coating retained throughout exposure to the conditions of the test.

Glass coated polycarbonate lenses made by the process of the invention do not require hydroxylation of the surface for satisfactory adhesion of the assembly upon exposure to conditions of high humidity and temperature. The application of said base coating under vacuum conditions of lower than $1 \times 10^{-4}$ torr. acts as a "tie coat" providing a surface having excellent adhesion to the evaporable glass outer coating which is subsequently applied under vacuum conditions of lower than $5 \times 10^{-4}$ torr.

Generally, said base coating composed of silicon monoxide or silicon monoxide and silicon dioxide is formed by treating the hydroxylated surface with silica monoxide heated to vaporization temperature in an oxygen atmosphere to provide a layer at least one molecule in thickness. the evaporable glass outer coating is applied to a thickness of about 1 to about 6 micrometers and higher. Typically, evaporation of glass takes place in about 5 to 30 minutes in high vacuum, as previously described, with the substrate been initially heated prior to coating to about 40° C to about 100° C.

It is believed that a bond more tenacious than would result from hydrogen bonding occurs between the plastic lens substrate and said vitreous base coating in the process of the present invention and this is an explanation for the greatly improved adhesion under conditions of high humidity and water soaking that is characteristic of the assemblies of the present invention. It is theorized that covalent bonding occurs between hydroxylated diallyl glycol carbonates of the invention and the subsequently applied base "tie coating".

As evaporable glasses, several suitable materials have been found. While a glass in which the essential components are boron oxide and silicon dioxide with up to 5% by weight of sodium monoxide has been found to be particularly suitable as an evaporable glass outer coating, alternate evaporable glasses compositions have been found suitable in the process of the invention. For instance, it has been found possible to use a pure silica present in the amorphous form, or a commercial glass sold under the trademark "Vycor" which is essentially silica or alternately a glass sold under the trademark "Pyrex", a borosilicate glass of the following composition (all compositions by weight percent):

| | |
|---|---|
| $SiO_2$ | 80.2 |
| $B_2O_3$ | 13.5 |
| $Al_2O_3$ | 2.2 |
| $Na_2O$ | 4.0 |
| $CaO$ | 0.1 |

Generally, the evaporable glass coating which forms the external layer can be of any glass which is capable of being deposited by vapor deposition preferably effected under a high vacuum lower than $5 \times 10^{-4}$ torr.

Synthetic polymers adaptable to the process are those useful for their optical properties over a temperature range of −20° C to 80° C. These include, besides the allyl resins such as the diethylene glycol diallyl carbonates, thermoplastic resins such as polycarbonates which are linear esters of carbonic acid with aliphatic or aromatic dihydroxy compounds. An example of a polycarbonate is the resin sold under the trademark "Lexan" by General Electric Company.

The following examples illustrate the invention but are to be considered in no way as limitations thereof. In this specification and claims all proportions are by weight and all temperatures are in degree centigrade unless otherwise indicated.

EXAMPLE 1

A concavo-convex lens made of a diallyl diethylene glycol carbonate sold under the trademark "CR 39" by PPG Industries, Inc. having a diameter of 60 mm and a thickness of 2.5 mm was thoroughly dried by heating to 160° F for 15 hours and then surface treated to improve the adhesion of vitreous coatings to be subsequently applied to the outer or convex side of the lens. A 10% solution of sodium hydroxide in methyl alcohol was prepared and the convex side of the lens was exposed to this solution at room temperature for a period of 20 minutes.

Next the lens was coated with a mixture of silicon monoxide and silicon dioxide by utilizing a conventional process of evaporation using a vacuum of $4 \times 10^{-5}$ torr. in an oxygen atmosphere and condensation of the vapor only on the convex side of the lens. By such a process, a coating composed of a mixture of SiO and $SiO_2$ is formed on the convex side of the lens. A refractive index of 1.5 is obtained for the coating. A film of 0.2 micrometer of base coating is thus applied to the lens.

The silicon dioxide coated lens is mounted on a support in a vacuum chamber at a distance of about 550 mm above a water cooled crucible which contains the glass to be evaporated having a chemical analysis expressed in weight percent as follows:

| | |
|---|---|
| silica ($SiO_2$) | 83.3 |
| aluminum oxide ($Al_2O_3$) | 2.3 |
| sodium oxide ($Na_2O$) | 2.1 |
| potassium oxide ($K_2O$) | 0.3 |
| fluoride ($F_2$) | 0.2 |
| boron oxide ($B_2O_3$) | 11.8 |

The chamber was pumped down to high vacuum, the initial evaporation pressure was $6 \times 10^{-6}$ torr. and the final evaporation pressure was $2.6 \times 10^{-6}$ torr. The contents of the crucible were heated by an electron beam focused on the surface of the glass in the crucible for the evaporation of the glass. Prior to the evaporative coating process the diallyl diethylene glycol carbonate lens was heated to a temperature of 70° C and a final temperature of 58° C was obtained upon conclusion of the process. The electron beam acceleration voltage was 4 to 5 kV, the electron beam emission current was 400 mA and the film thickness deposited was 4 microns. This coating thickness was obtained after an evaporation time of 20 minutes. The apparatus was then flooded with air and the lens taken out. The lens was found to be highly scratch resistant. The base coating of a mixture of silicon dioxide and silicon monoxide and evaporable glass outer coating were found to be well bonded to the lens surface and resistant to removal and edge failure upon a test consisting of exposure to three cycles of 8 hours at 95% RH, 160° F and 8 hours at ambient temperature and humidity.

EXAMPLE 2 (comparative) (forming no part of this invention)

The alkali pretreatment of the diallyl glycol carbonate lens shown in Example 1 was omitted and a base coating of 0.2 micrometer thickness and an evaporable glass coating of 4 micrometers thickness was applied to the lens outer surface according to the procedures shown in Example 1. The coating layers on the lens were found to be highly scratch resistant but the adhesion of the vitreous coatings to the lens surface was found to be less as indicated by adhesive failure during exposure to moisture and heat as in Example 1.

EXAMPLE 3 (comparative) (forming no part of this invention)

In accordance with the procedure of Example 1, an alkali pretreatment was performed on the outer surface of the diallyl diethylene glycol carbonate lens of Example 1. The treated surface was then coated only with a 4 micrometers thickness of an evaporable glass and tested in accordance with the procedure of Example 1. These results indicate poor adhesion of the coating.

EXAMPLE 4

In accordance with the procedure of Example 1, alkali treatment of the diallyl diethylene glycol carbonate lenses of Example 1 were effected using instead, potassium hydroxide. The procedure of Example 1 was continued with the application of the silicon dioxide film in the amount of 4 micrometers and an evaporable glass film subsequently was applied over the silicon dioxide film, the evaporable glass thickness being 4 micrometers. Test results under the conditions specified above indicate that satisfactory results can be obtained.

EXAMPLE 5

The procedure of Example 1 was repeated except that for the evaporable glass used in Example 1 there was used alternately and in turn a pure silica (amorphous), a fused silica having a purity of 96 to 99.99% silicon dioxide, a glass sold under the trademark "Vycor" and a glass sold under the trademark "Pyrex", the composition of which is given above. Tests performed on lenses coated in accordance with the above indicate that these alternate evaporable glass coatings have excellent adhesion and the lenses satisfactorily pass the water resistance tests detailed above.

EXAMPLE 6

The procedure of Example 1 is repeated except that no hydroxylation of the surface of the synthetic polymer is effected. The polymer lens used was an aromatic polycarbonate sold under the trademark "Lexan".

The lens was coated on both sides. Tests performed on coated lenses prepared above indicate excellent adhesion and water resistance is obtained.

Although the present invention has been described with reference to the specific details of certain embodiments thereof, it is not intended that such details shall be regarded as limitations upon the scope of the invention.

What is claimed is:

1. The method of coating an ophthalmic quality lens of diallyl glycol carbonate polymer comprising the steps of:
   1. first step - hydroxylating the lens surface to be coated;
   2. second step - applying to the hydroxylated surface of the lens by vacuum deposition a base coating of a material selected from the group consisting of silicon monoxide and a mixture of silicon dioxide and silicon monoxide, by evaporation of silicon monoxide in an oxygen atmosphere under a vacuum lower than $1 \times 10^{-4}$ torr, said base coating being at least one molecule in thickness; and
   3. third step - applying to the coated surface of the lens of the second step by vacuum deposition an outer coating of evaporable glass said evaporable glass being in a thickness of about one micrometer or higher, said glass coating being applied at a pressure lower than $5 \times 10^{-4}$ torr.

2. A method according to claim 1 wherein the process includes as the first step the hydroxylating of the surface of said lens by alkali treatment.

3. A method according to claim 2 wherein said alkali is selected from the group consisting of sodium hydroxide and potassium hydroxide.

4. A method according to claim 3 wherein said alkali is utilized as an aqueous solution.

5. A method according to claim 2 wherein said vacuum deposition of the evaporable glass is effected in a vacuum lower than $5 \times 10^{-4}$ torr.

6. A method according to claim 2 wherein said evaporable glass is selected from the group consisting of (1) a glass consisting essentially of boron oxide and silicon dioxide containing less than 5% by weight of $Na_2O$ (2) fused silica, (3) and a borosilicate glass of the following weight percentage composition:

| | |
|---|---|
| $SiO_2$ | 80.2 |
| $B_2O_3$ | 13.5 |
| $Al_2O_3$ | 2.2 |
| $Na_2O$ | 4.0 |
| $CaO$ | 0.1 |

7. A method according to claim 2 wherein said vacuum deposition of said base coating is effected in a vacuum lower than $1 \times 10^{-4}$ torr.

8. A method according to claim 2 wherein said alkali is utilized as an aqueous solution of sodium hydroxide and wherein said evaporable glass is a glass comprising boron oxide and silicon dioxide and up to 5% by weight of $Na_2O$ and is applied in a thickness of about 4 micrometers.

9. The method of coating an ophthalmic quality lens of an aromatic polycarbonate comprising the steps of:
   1. first step - applying to the lens by vacuum deposition a base coating of a material selected from the group consisting of silicon monoxide, and a mixture of silicon dioxide and silicon monoxide, by evaporation of silicon monoxide in an oxygen atmosphere under a vacuum lower than $1 \times 10^{-4}$ torr, said base coating being at least one molecule in thickness; and
   2. second step - applying to the coated surface of the lens of the first step by vacuum deposition an outer coating of evaporable glass under vacuum, said evaporable glass being in a thickness of about one micrometer or higher, said glass coating being applied at a pressure lowr than $5 \times 10^{-4}$ torr.

* * * * *